(12) United States Patent
Moon et al.

(10) Patent No.: US 8,766,287 B2
(45) Date of Patent: Jul. 1, 2014

(54) LIGHT EMITTING DEVICE, LIGHT EMITTING DEVICE PACKAGE, AND LIGHTING DEVICE WITH THE SAME

(75) Inventors: Ji Hyung Moon, Seoul (KR); Sang Youl Lee, Seoul (KR); Chung Song Kim, Seoul (KR); Kwang Ki Choi, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 81 days.

(21) Appl. No.: 13/242,345

(22) Filed: Sep. 23, 2011

(65) Prior Publication Data
US 2012/0138969 A1 Jun. 7, 2012

(30) Foreign Application Priority Data
Dec. 20, 2010 (KR) .................. 10-2010-0130589

(51) Int. Cl.
| | | |
|---|---|---|
| H01L 29/18 | (2006.01) | |
| H01L 33/38 | (2010.01) | |
| H01L 25/075 | (2006.01) | |
| H01L 33/62 | (2010.01) | |
| H01L 27/15 | (2006.01) | |
| H01L 33/20 | (2010.01) | |
| F21K 99/00 | (2010.01) | |

(52) U.S. Cl.
CPC .......... *H01L 33/382* (2013.01); *H01L 33/387* (2013.01); *H01L 25/0753* (2013.01); *H01L 33/62* (2013.01); *H01L 27/153* (2013.01); *H01L 33/20* (2013.01); *F21K 9/00* (2013.01)
USPC ......................................................... 257/88

(58) Field of Classification Search
CPC . H01L 33/382; H01L 33/387; H01L 25/0753; H01L 33/62; H01L 27/153; H01L 33/02; F21K 9/00
USPC ............................................................. 257/88
See application file for complete search history.

(56) References Cited

U.S. PATENT DOCUMENTS

| | | | |
|---|---|---|---|
| 2011/0068359 A1* | 3/2011 | Yahata et al. | 257/98 |
| 2012/0018763 A1* | 1/2012 | Engl et al. | 257/99 |
| 2012/0018764 A1* | 1/2012 | Choi et al. | 257/99 |
| 2012/0235168 A1* | 9/2012 | Katsuno et al. | 257/88 |

FOREIGN PATENT DOCUMENTS

JP 2008199004 8/2008
(Continued)

OTHER PUBLICATIONS

"Optical Properties of Selected Elements," in CRC Handbook of Chemistry and Physics, 93rd Edition (Internet Version 2013), W. M. Haynes, ed., CRC Press/Taylor and Francis, Boca Raton, FL.*

*Primary Examiner* — Anthony Ho
(74) *Attorney, Agent, or Firm* — Lowe Hauptman & Ham, LLP

(57) ABSTRACT

The present invention relates to a light emitting device, a light emitting device package, and a lighting device with the same. The light emitting device includes a light emitting structure including a first conductive type semiconductor layer, an active layer, and a second conductive type semiconductor layer, a second electrode layer formed on an underside of the light emitting structure connected to the second conductive type semiconductor layer electrically, a first electrode layer in contact with the first conductive type semiconductor layer passed through the second conductive type semiconductor layer and the active layer, and an insulating layer formed between the second electrode layer and the first electrode layer, between the second conductive type semiconductor layer and the first electrode layer, and between the active layer and the first electrode layer.

20 Claims, 20 Drawing Sheets

(56) References Cited

FOREIGN PATENT DOCUMENTS

| KR | 1020090103955 | 10/2009 | |
| KR | 1020100044726 | 4/2010 | |
| KR | 1020100080819 | 7/2010 | |
| WO | WO2009/135457 | 11/2009 | |
| WO | WO 2010009690 A1 | * | 1/2010 |
| WO | WO 2010056083 A2 | * | 5/2010 |

* cited by examiner

LIGHT EMITTING DEVICE, LIGHT EMITTING DEVICE PACKAGE, AND LIGHTING DEVICE WITH THE SAME

CROSS REFERENCE TO RELATED APPLICATION

This application claims the priority of under 35 U.S.C. §119 to Korean patent Application No. 10-2010-0130589, filed on Dec. 20, 2010, which is hereby incorporated by reference as if fully set forth herein.

TECHNICAL FIELD

1. Field of the Disclosure

The embodiments relate to a light emitting device, a light emitting device package, and a lighting device with the same.

2. Background

A light emitting diode LED is a kind of semiconductor device which converts electricity to a UV ray or a light by using a characteristic of a compound semiconductor for transmitting/receiving a signal or using as a light source.

A group III-V nitride semiconductor is spot lighted as an essential material of the light emitting diode LED or a laser diode LD owing to its physical and chemical characteristics.

Since the light emitting diode does not contain materials harmful to an environment, such as mercury Hg, used in the present incandescent lamps and fluorescent lamps, the light emitting diode is environment friendly excellently, and replaces the present light sources owing to a long life time, low power consumption, and the like.

SUMMARY

Accordingly, the embodiment is directed to a light emitting device, a light emitting device package, and a lighting device with the same.

The embodiments can improve light emitting efficiency, and widen a beam angle; and a light emitting device package, and a lighting device with the same. A light emitting device includes a light emitting structure including a first conductive type semiconductor layer, an active layer, and a second conductive type semiconductor layer, a second electrode layer formed on an underside of the light emitting structure connected to the second conductive type semiconductor layer electrically, a first electrode layer that passes through the second conductive type semiconductor layer and the active layer to contact with the first conductive semiconductor layer, and an insulating layer formed between the second electrode layer and the first electrode layer, between the second conductive type semiconductor layer and the first electrode layer, and between the active layer and the first electrode layer, wherein the first electrode layer includes a reflective layer having an extension to the first conductive type semiconductor layer passed through an ohmic layer in contact with the first conductive type semiconductor layer, the second conductive type semiconductor layer, and the active layer, wherein the first electrode layer includes an ohmic layer in contact with the first conductive type semiconductor layer, and a reflective layer that passes through the second conductive type semiconductor layer, and the active layer to have an extension to the first conductive type semiconductor layer.

The reflective layer can be positioned on an underside of the ohmic layer.

The ohmic layer and the reflective layer can be sloped.

The reflective layer can have a portion in contact with the first conductive type semiconductor layer.

An end portion of the reflective layer surrounds the ohmic layer.

The ohmic layer can have at least one portion that passes through the reflective layer.

The ohmic layer can have at least one portion that passes through the reflective layer.

The reflective layer can have a thickness thicker than the ohmic layer.

The reflective layer can have a reflectivity greater than 80%.

The reflective layer can be formed of one selected from Ag, Al and Rh and a selective combination thereof.

The first electrode layer can include a bonding layer in contact with the insulating layer, and the reflective layer can be in contact with the insulating layer and the bonding layer.

The bonding layer can passes through the insulating layer and the second electrode layer to contact with an underside of the reflective layer.

The first electrode layer can include a bonding layer in contact with the insulating layer, and the reflective layer can include a first reflective portion that passes through the reflective layer, second conductive type semiconductor layer, and the active layer, and a second reflective portion positioned on an underside of the first reflective portion having a width greater than a width of the first reflective portion.

The width of the second reflective portion is less than 5 times of the width of the first reflective portion.

The first conductive type semiconductor layer can have an upper surface with a roughness formed thereon.

The light emitting device can further include a re-absorption preventive layer formed on an upper surface of the first conductive type semiconductor layer.

The light emitting device can further include an electrode pad on one side open region of the ohmic layer and the reflective layer.

The light emitting device can further include a passivation layer formed at one side of the light emitting structure adjacent to the one side open region for preventing shorts from taking place between the light emitting structure and the electrode pad.

In another aspect of the embodiment, a lighting device includes a power source coupler, and a light emitting module fixed to the heat sink and including a light emitting device as claimed in claim 1 mounted to a circuit board.

In another aspect of the embodiment, a display device includes a circuit board, a light emitting device as claimed in claim 1 mounted to the circuit board, and a light guide plate for guiding a light from the light emitting device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 3 illustrates a section of a light emitting device in accordance with another embodiment of the.

DESCRIPTION OF SPECIFIC EMBODIMENTS

Figure 1:
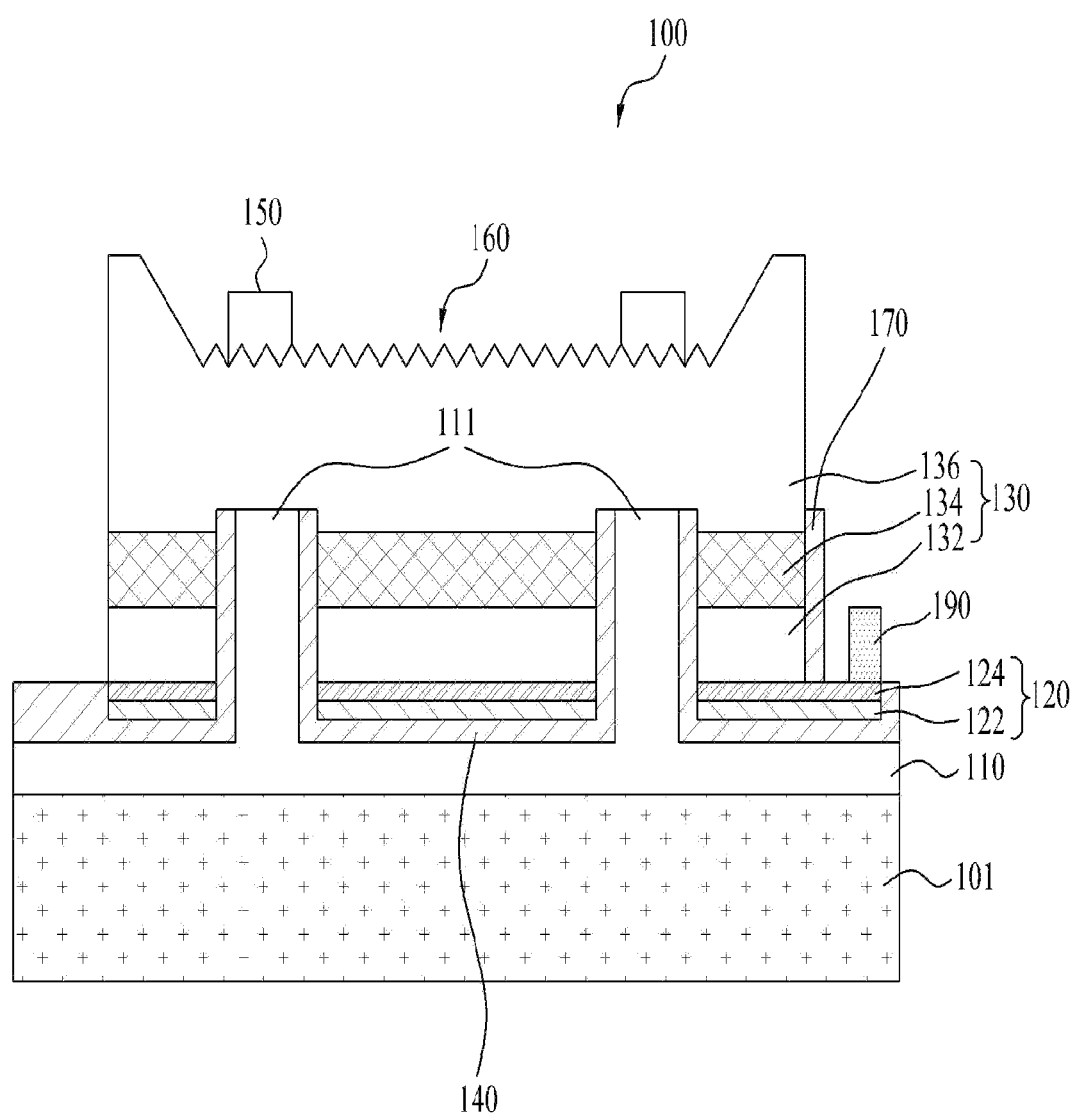
FIG. 1 illustrates a section of a light emitting device in accordance with an embodiment.

Reference will now be made in detail to the specific embodiments, examples of which are illustrated in the accompanying drawings. Wherever possible, the same reference numbers will be used throughout the drawings to refer to the same or like parts.

In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A thickness or a size of a layer shown in a drawing can be exaggerated, omitted or shown schematically for convenience or clarity of description. And, a size of an element may not be shown to scale, perfectly.

FIG. 1 illustrates a section of a light emitting device in accordance with an embodiment.

Referring to FIG. 1, the light emitting device 100 can include a supporting substrate 101, a first electrode layer 110, a second electrode layer 120, a light emitting structure 130, an insulating layer 140, a re-absorption preventive layer 150, a passivation layer 170, and a first electrode pad 190.

The light emitting device 100 can include an LED constructed of a plurality of compound semiconductor layers, for an example, a compound semiconductor of group III-V elements, wherein the LED can be a color LED which can emit a blue, a green or a red color light, or an UV LED. The light from the LED can be produced by using, but not limited to, various semiconductors.

The supporting substrate 101 can be a conductive substrate or an insulating substrate for supporting the light emitting structure 130. For an example, the supporting substrate 101 can be formed of at least one of copper Cu, gold Au, nickel Ni, molybdenum, copper-tungsten Cu—W, a carrier wafer (For an example, Si, Ge, GaAs, ZnO, SiC), and a conductive sheet.

The first electrode layer 110 is formed on the supporting substrate 101. For an example, the first electrode layer 110 can be formed of one selected from a group of materials including Ag, Ni, Al, Rh, Pd, Ir, Ru, Mg, Zn, Pt, Au, and Hf and a selective combination thereof. And, the first electrode layer 110 can be constructed of single or multiple layers of reflective electrode materials each having an ohmic characteristic. For an example, the first electrode layer 110 can be formed of materials including, but not limited to, above metals and at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO. If the first electrode layer 110 has an ohmic function, no ohmic layer can be formed.

The second electrode layer 120 is formed on the first electrode layer 110, and the insulating layer 140 is formed between the second electrode layer 120 and the first electrode layer 110 for insulating the first electrode layer 110 from the second electrode layer 120.

The second electrode layer 120 can have a structure of, but not limited to, ohmic layer/reflective layer/bonding layer, or can be a stack of reflective layer (including ohmic)/bonding layer. For an example, the second electrode layer 120 can have a reflective layer 122 and the ohmic layer 124 stacked on the insulating layer 140 in succession.

The reflective layer 122 can be in contact with an underside of the ohmic layer 124, and formed of a reflective material having reflectivity greater than 50%. The reflective layer 122 can be formed of one selected from a group of materials including Ag, Ni, Al, Rh, Pd, Ir, Ru, Mg, Zn, Pt, Au, and Hf and a selective combination of above materials, or constructed of multiple layers of above metals and a light transmissive conductive material of IZO, IZTO, IAZO, IGZO, IGTO, AZO, and ATO. For an example, the reflective layer 122 can be a stack of IZO/Ni, AZO/Ag, IZO/Ag/Ni, or AZO/Ag/Ni. If the reflective layer 122 is formed of a material which makes ohmic contact with the light emitting structure, the ohmic layer 124 may not be formed additionally, but not limited to this.

The ohmic layer 124 can be formed of a light transmissive conductive layer and a metal selectively. For an example, the ohmic layer 124 can be constructed of single or multiple layers of at least one selected from a group of materials including ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO.

The ohmic layer 124 is provided for making smooth carrier injection into a second conductive type semiconductor layer 132, but is not essential.

The light emitting structure 130 is formed on the second electrode layer 120. The light emitting structure 130 can be a successive stack of the second conductive type semiconductor layer 132, an active layer 134, and a first conductive semiconductor layer 136.

The second conductive type semiconductor layer 132 can be formed on the ohmic layer 124 such that the second conductive type semiconductor layer 132 is in contact with an upper side of the ohmic layer 124. The second conductive type semiconductor layer 132 is formed of a compound semiconductor of group III-V elements doped with second conductive type dopant, for example, one selected from a group of materials including GaN, AlN, AlGaN, InGaN, InN, InAlGaN, AlInN, AlGaAs, GaP, GaAs, GaAsP, and AlGaInP. The second conductive type dopant can be a p type dopant, such as Mg, and Zn. The second conductive type semiconductor layer 132 can have single or multiple layers, but not limited to this.

The active layer 134 is formed on the second conductive type semiconductor layer 132, and can include any one selected from single quantum well structure, multiple quantum well structure MQW, quantum point structure, or quantum line structure. The active layer 134 can be constructed of a well layer and a barrier layer, for an example, well layer/

GaN barrier layer or InGaN well layer/AlGaN barrier layer of compound semiconductor materials of group III-V elements.

There can be a conductive type clad layer formed of an AlGaN group semiconductor between the active layer 134 and the first conductive semiconductor layer 136, or between the active layer 134 and the second conductive type semiconductor layer 132.

The first conductive semiconductor layer 136 is formed on the active layer 134 of a compound semiconductor of group III-V elements doped with first conductive type dopant, for an example, one selected from a group of materials including GaN, AlN, AlGaN, InGaN, InN, InAlGaN, AlInN, AlGaAs, GaP, GaAs, GaAsP, and AlGaInP. The first conductive type dopant can be N type dopant, such as Si, Ge, Sn, Se, and Te.

The first conductive type semiconductor layer 136 can have single or multiple layers, but not limited to this. The first conductive semiconductor layer 136 has an upper surface having roughness 160 formed thereon for improving light extraction efficiency.

The first electrode layer 110 passes through the second electrode layer 120, the second conductive type semiconductor layer 132, and the active layer 134 to contact with the first conductive semiconductor layer 136. That is, the first electrode layer 110 has a lower electrode layer in contact with the supporting substrate 101 and at least one contact electrode 111 which is a branch from the lower electrode layer in contact with the first conductive semiconductor layer 136, electrically.

The contact electrode 111 to the first electrode layer 110 can be plural spaced from one another for making smooth supply of a current to the first conductive semiconductor layer 136. The contact electrode 111 can have at least one of patterns selected from, but not limited to, a radial pattern, a cross pattern, a line pattern, a curve pattern, a loop pattern, a hook pattern, and a ring pattern.

The insulating layer 140 is positioned between the first electrode layer 110 and the second electrode layer 120 for insulating the first electrode layer 110 from the second electrode layer 120. In a state shown, the insulating layer 140 is formed between the first electrode layer 110 and the reflective layer 122. The insulating layer 140 is formed to surround the first electrode layer 110 to block electric shorts between the first electrode layer 110 and other layers 120, 132, and 134. The insulating layer 140 can be formed of a light transmissive material, for an example, $SiO_2$.

The re-absorption preventive layer 150 is formed on the first conductive semiconductor layer 136.

The re-absorption preventive layer 150 can improve light efficiency by preventing the light emitting device 100 from re-absorbing the light emitted from the light emitting device 100 after reflected at a fluorescent material and a light emitting device package. The re-absorption preventive layer 150 can be formed of at least one selected from a group of materials including Ag, Rh, Ni, Au, Pd, Ir, Ti, Pt, W, and Al, and an alloy or a solid solution thereof. The re-absorption preventive layer 150 can overlap with the contact electrode 111 in a vertical direction.

The ohmic layer 124 and/or the reflective layer 122 can have one opened side region, and the first electrode pad 190 is formed on the one opened side region. The first electrode pad 190 can have an electrode shape.

And, there can be the passivation layer 170 formed at a side of the light emitting structure 130 adjacent to the one opened side region. The passivation layer 170 of an insulating material prevents electric short from taking place between the light emitting structure 130 and the first electrode pad 190.

In the meantime, a portion of the light from the active layer 134 of the light emitting structure 130 is incident on the first electrode layer 110 passed through the insulating layer 140. Since the light efficiency of the light emitting device 100 drops if the light is absorbed by the first electrode layer 110, it is favorable that the light incident on the first electrode layer 110 is reflected, adequately. Accordingly, though it is preferable that the first electrode layer 110 is formed of a material having an ohmic characteristic, high reflectivity, and high adhesiveness, an Al group material has a low reflectivity though Al group material has the ohmic characteristic and the adhesiveness, and Ag has high reflectivity though the Ag has no ohmic characteristic, and poor adhesiveness.

Figure 2A:
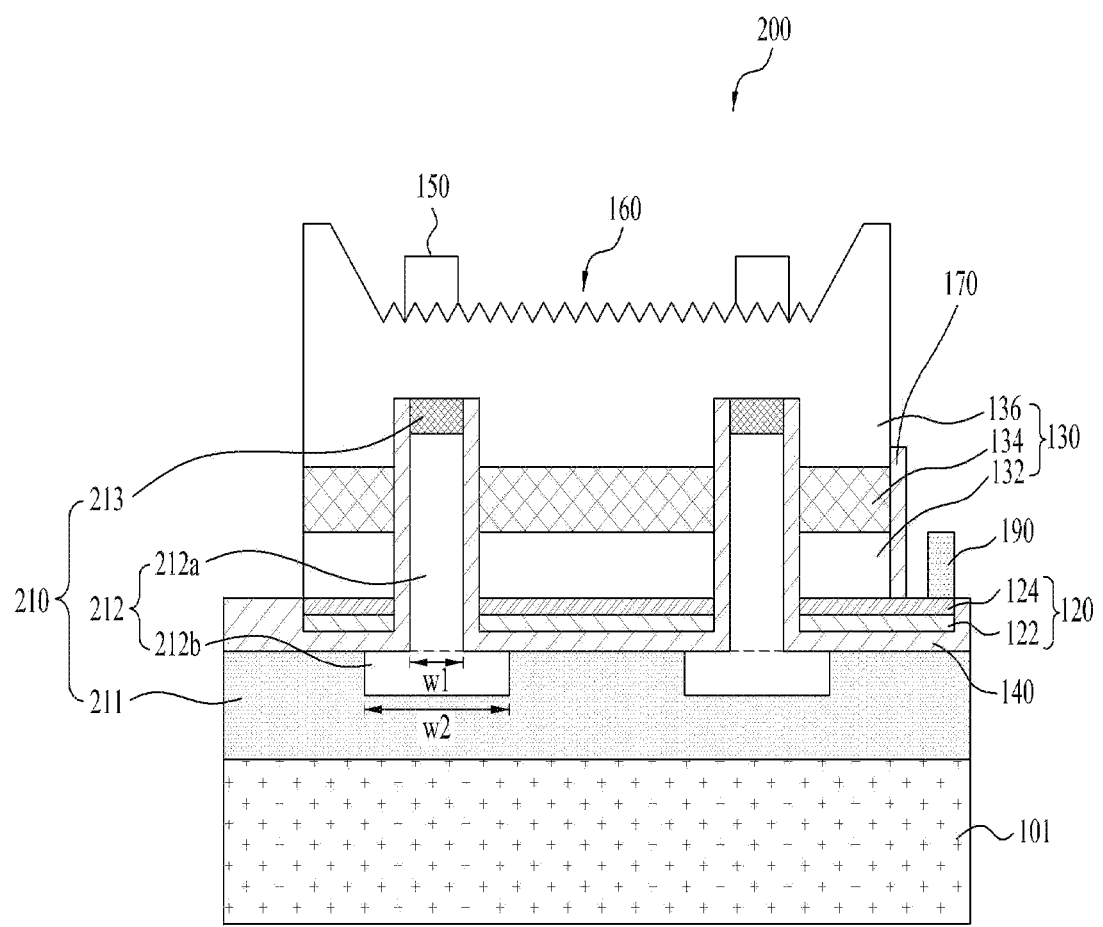
FIGS. 2A~2C illustrate sections of light emitting devices, respectively.
Figure 2B:
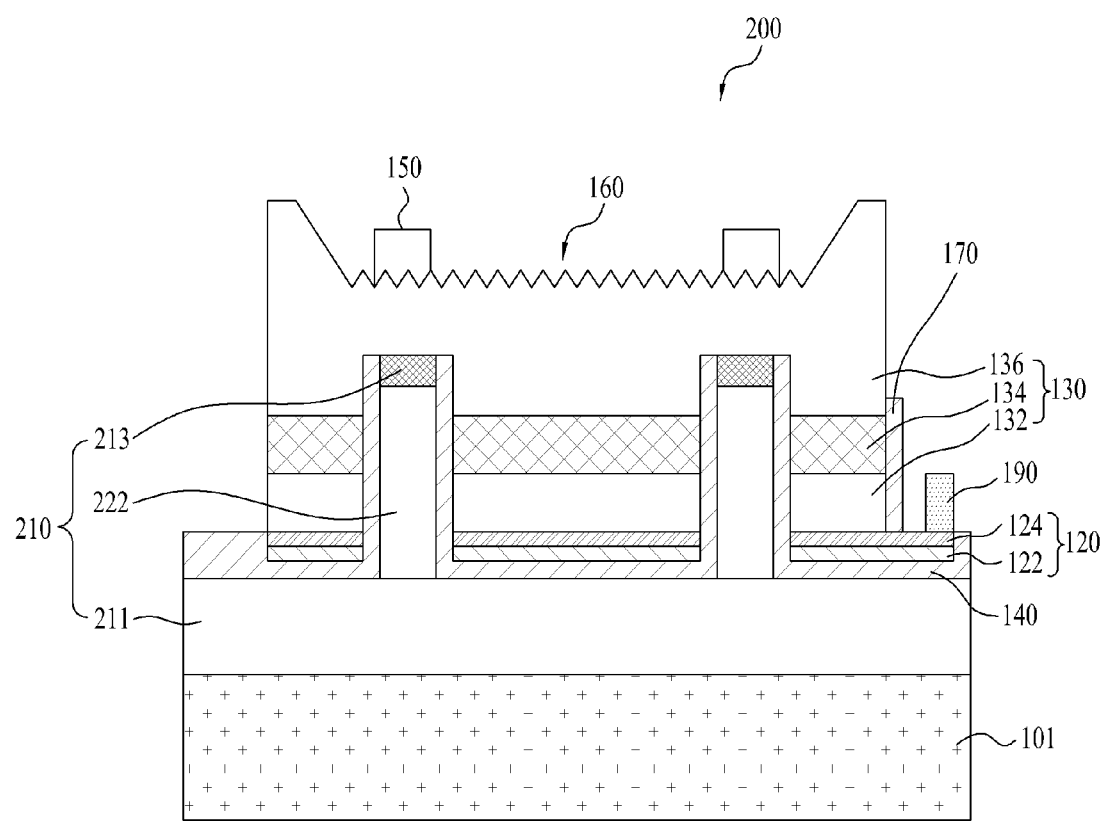
Figure 2C:
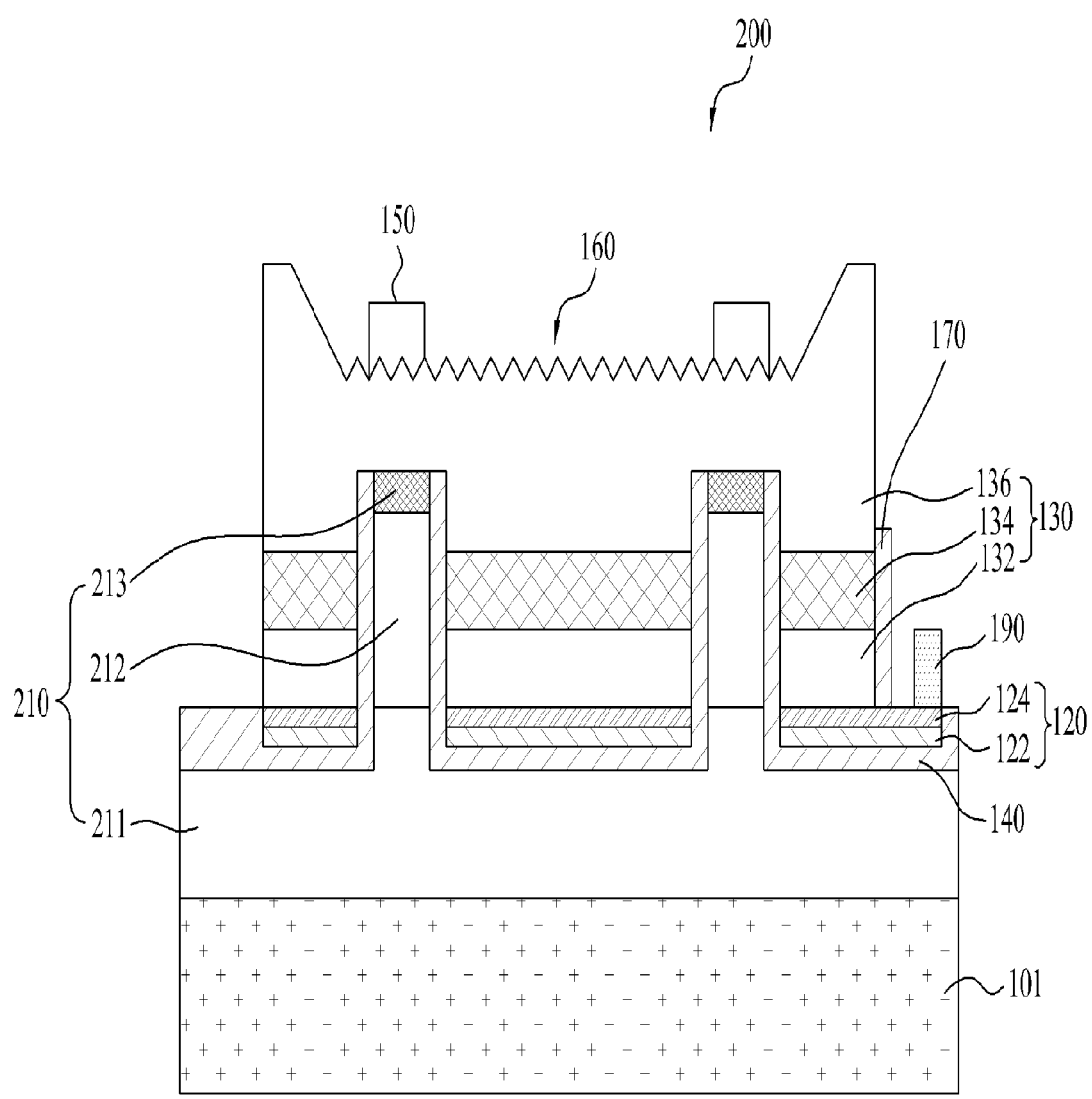

FIGS. 2A~2C illustrate sections of light emitting devices in accordance with other embodiments, respectively. Elements identical to the embodiment described with reference to FIG. 1 will be given the same reference numerals, and repetitive description thereof will be omitted.

Referring to FIG. 2A, the light emitting device 200 can include a supporting substrate 101, a first electrode layer 210, a second electrode layer 120, a light emitting structure 130, an insulating layer 140, a re-absorption preventive layer 150, a passivation layer 170, and a first electrode pad 190.

The first electrode layer 210 is formed on the supporting substrate 101, and can include a bonding layer 211, a reflective layer 212, and an ohmic layer 213.

The bonding layer 211 is positioned between the insulating layer 140 and the supporting substrate 101. The bonding layer 211 can be formed of one selected from a group of materials including Ni, Al, Rh, Pd, Ir, Ru, Mg, Zn, Pt, Au, and Hf and a selective combination thereof. For an example, the bonding layer 211 can be formed by using above materials and conductive materials such as IZO, IZTO, IAZO, IGZO, IGTO, AZO, and ATO. The bonding layer 211 can be formed of a material having good adhesiveness.

The reflective layer 212 can be formed of a material having high reflectivity, for an example, higher than 80%. For an example, the reflective layer 212 can be formed of one selected from a group of materials including Al, Ag, and Rh and a selective combination thereof in single or multiple layers.

The reflective layer 212 includes a first reflective portion 212a and a second reflective portion 212b. The first reflective portion 212a passes through the insulating layer 140, the second conductive type semiconductor layer 132, and the active layer 134 to have an extension toward the first conductive type semiconductor layer 136. The first reflective portion 212a makes the light incident thereon from the light emitting structure 130, particularly, the active layer 134 to reflect well, for reducing the light absorbed by the first reflective portion 212a to improve the light efficiency of the light emitting device 200, and making the light from the active layer 134 to reflect and diverge at the first reflective portion 212a to make a beam angle thereof greater. The second reflective portion 212b is positioned on an underside of the first reflective portion 212a between the insulating layer 140 and the bonding layer 211. If the second reflective portion 212b is formed of a material having high reflectivity, the second reflective portion 212b is liable to have an adhesive force relatively lower than the bonding layer 211. If the second reflective portion 212b covers the bonding layer 211 fully, layer peeling is liable to take place between the second reflective portion 212b and the bonding layer 211, and between the second reflective portion 212b and the insulating layer 140 due to weak adhesive force. Therefore, the second reflective portion 212b is formed, not to cover the bonding layer 211 fully, but on the bonding layer 211 partially, making a portion of the bonding layer 211 to be in direct contact with the insulating layer 140. The second reflective portion 212b has a width W2 less than 5 times of a width W1 of the first reflective portion 212a.

Referring to FIG. 2B, the reflective layer 212 can be constructed only of the first reflective portion 212a without the second reflective portion 212b. In this case, the position the second reflective portion 212b occupies is filled with the bonding layer 211, and the bonding layer 211 is in contact with the insulating layer 140 throughout a surface thereof. There is the ohmic layer 213 formed on a top of the pass through portion 212a to be in contact with the first conductive type semiconductor layer 136.

Or, referring to FIG. 2C, the reflective layer 212 can be formed passed through even the active layer 134, and the second conductive type semiconductor layer 132. The bonding layer 211 can be formed to the second reflective portion 212a which passes though the second electrode layer 120 and the insulating layer 140.

The ohmic layer 213 is in ohmic contact with the first conductive type semiconductor layer 136, serves as an electrode, and can include a metal having a good ohmic characteristic, for an example, at least one of Pt, Ni, Au, Rh, and Pd and an alloy thereof. The ohmic layer 213 can include at least one of, but not limited to, ITO, IZO (InZnO), GZO (Ga—ZnO), AZO (Al—ZnO), AGZO (Al—Ga ZnO), IGZO (InGa ZnO), IrOx, RuOx, RuOx/ITO, Ni/IrOx/Au, and Ni/IrOx/Au/ITO. The ohmic layer 213 can have at least one of patterns, but not limited to, a radial pattern, a cross pattern, a line pattern, a curve pattern, a hook pattern, and a ring pattern.

The reflective layer 212 can be formed thicker than the ohmic layer 213. If the reflective layer 212 is thicker than the ohmic layer 213, the reflection of the light from the active layer 134 at the reflective layer 212 can be better.

The insulating layer 140 is positioned between the first electrode layer 210 and the second electrode layer 120 for insulating the first electrode layer 210 from the second electrode layer 120. In a shown state, the insulating layer 140 is formed between the first electrode layer 210 and the reflective layer 212. The insulating layer 140 formed to surround the first electrode layer 210 for blocking electric shorts between the first electrode layer 210 and other layers 120, 132, and 134.

Figure 3:
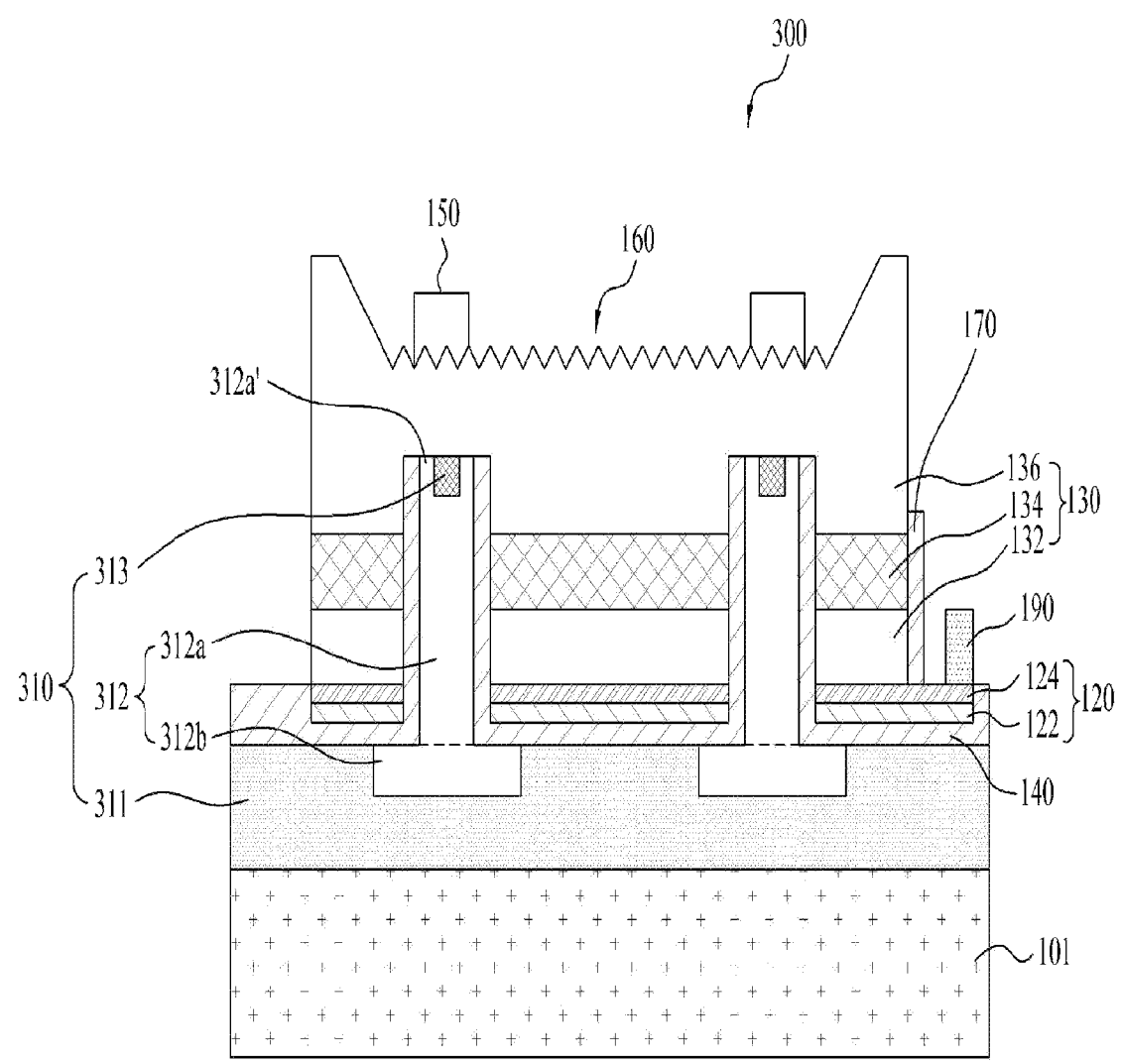

FIG. 3 illustrates a section of a light emitting device in accordance with another embodiment. Elements identical to the embodiment described with reference to FIG. 1 will be given the same reference numerals, and repetitive description thereof will be omitted.

Referring to FIG. 3, the light emitting device 300 includes a supporting substrate 101, a first electrode layer 310, a second electrode layer 120, a light emitting structure 130, an insulating layer 140, a re-absorption preventive layer 150, a passivation layer 170, and a first electrode pad 190.

The first electrode layer 310 is formed on the supporting substrate 101, and can include a bonding layer 311, a reflective layer 312, and an ohmic layer 313. The bonding layer 311, the reflective layer 312, and the ohmic layer 313 are identical to the bonding layer 211, the reflective layer 212, and the ohmic layer 213 in FIGS. 2A-2C in view of configuration, substantially. However, in the embodiment, an end portion 312a' of the reflective layer 312, i.e., an end portion 312a' of the pass through portion 312a surrounds the ohmic layer 313 and is in contact with the first conductive type semiconductor layer 136, for extending the reflective layer 312 toward the first conductive type semiconductor layer 136 further to enhance a reflection effect of the light by the reflective layer 312.

The reflective layer 312 can be formed thicker than the ohmic layer 313. If the reflective layer 312 is thicker than the ohmic layer 313, the reflection of the light from the active layer 134 at the reflective layer 312 can be better.

FIGS. 4A~4D illustrate sections of light emitting devices in accordance with other embodiments, respectively. Elements identical to the embodiment described with reference to FIG. 1 will be given the same reference numerals, and repetitive description thereof will be omitted.

Figure 4A:
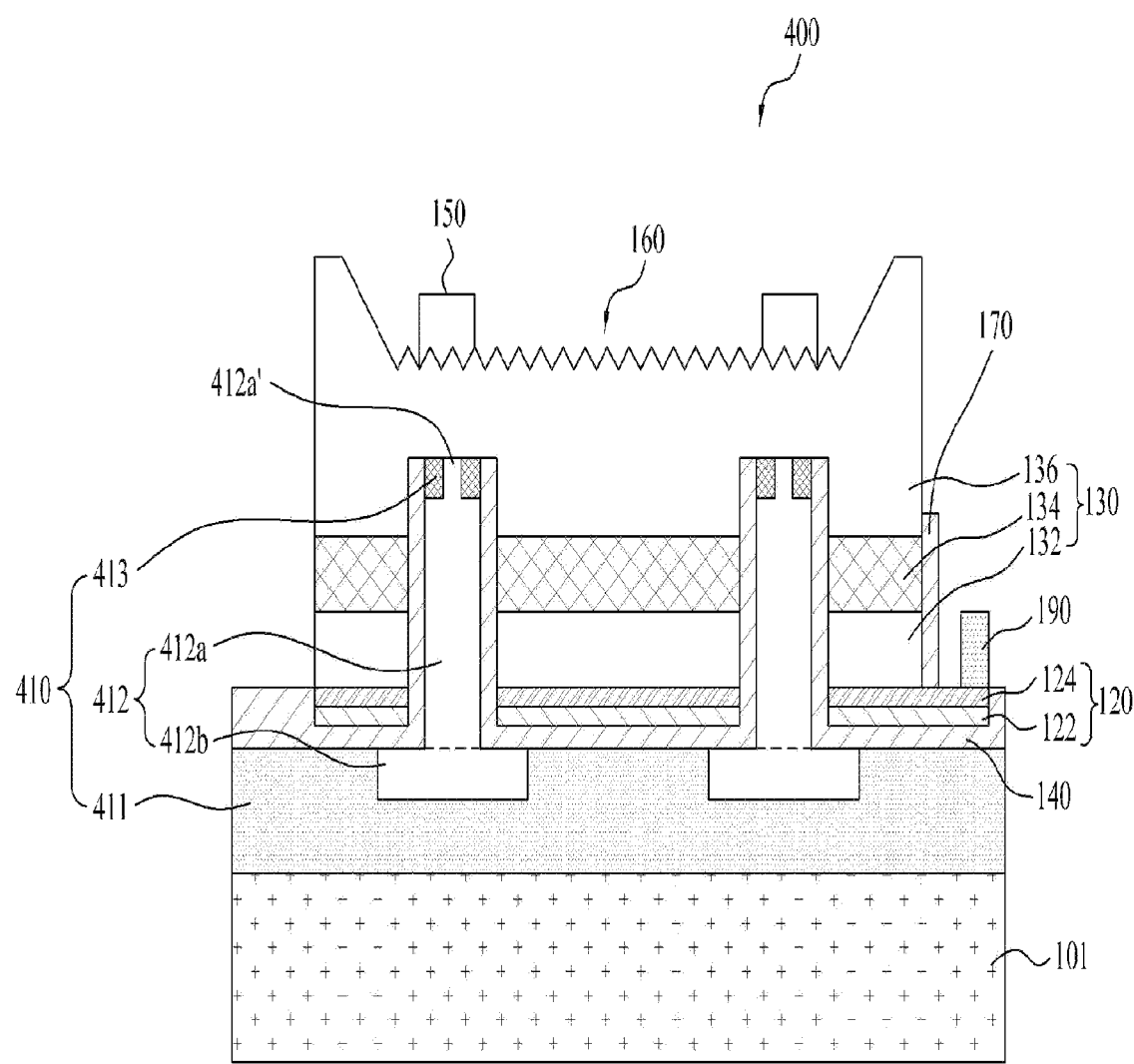
FIGS. 4A~4D illustrate sections of light emitting devices in accordance with other embodiments, respectively.

Referring to FIG. 4A, the light emitting device 400 includes a supporting substrate 101, a first electrode layer 410, a second electrode layer 120, a light emitting structure 130, an insulating layer 140, a re-absorption preventive layer 150, a passivation layer 170, and a first electrode pad 190.

The first electrode layer 410 is formed on the supporting substrate 101, and can include a bonding layer 411, a reflective layer 412, and an ohmic layer 413. The bonding layer 411, the reflective layer 412, and the ohmic layer 413 are identical to the bonding layer 211, the reflective layer 212, and the ohmic layer 213 in FIG. 2 in view of configuration, substantially. However, in the embodiment, an end portion 412a' of the reflective layer 412, i.e., an end portion 412a' of the pass through portion 412a is extended to be in contact with the first conductive type semiconductor layer 136, and the ohmic layer 413 surrounds the end portion 412a' of the pass through portion 412a.

The reflective layer 412 can be formed thicker than the ohmic layer 413. If the reflective layer 412 is thicker than the ohmic layer 413, the reflection of the light from the active layer 134 at the reflective layer 412 can be better.

The ohmic layer 413 and the reflective layer 412 are not limited to above, but can have many variations.

Figure 4B:
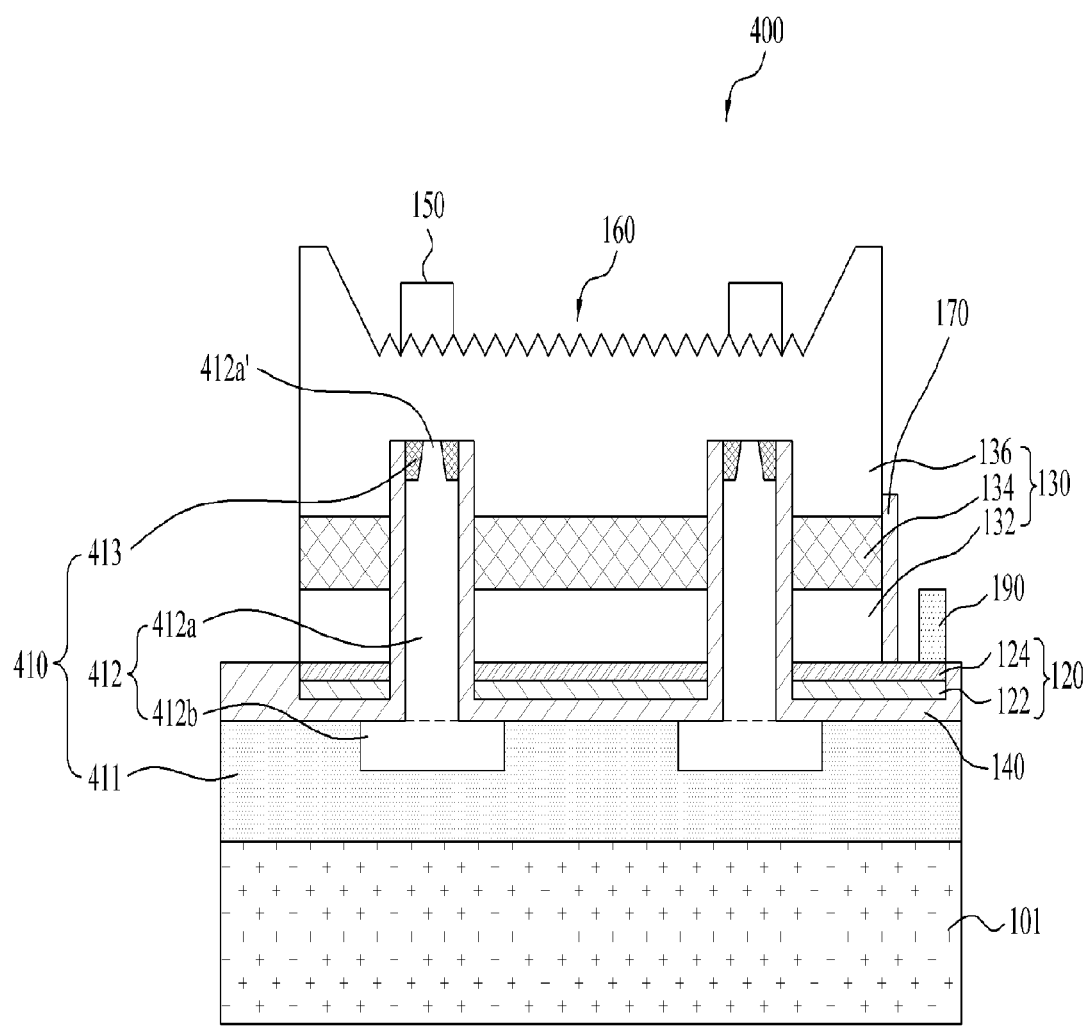
Figure 4C:
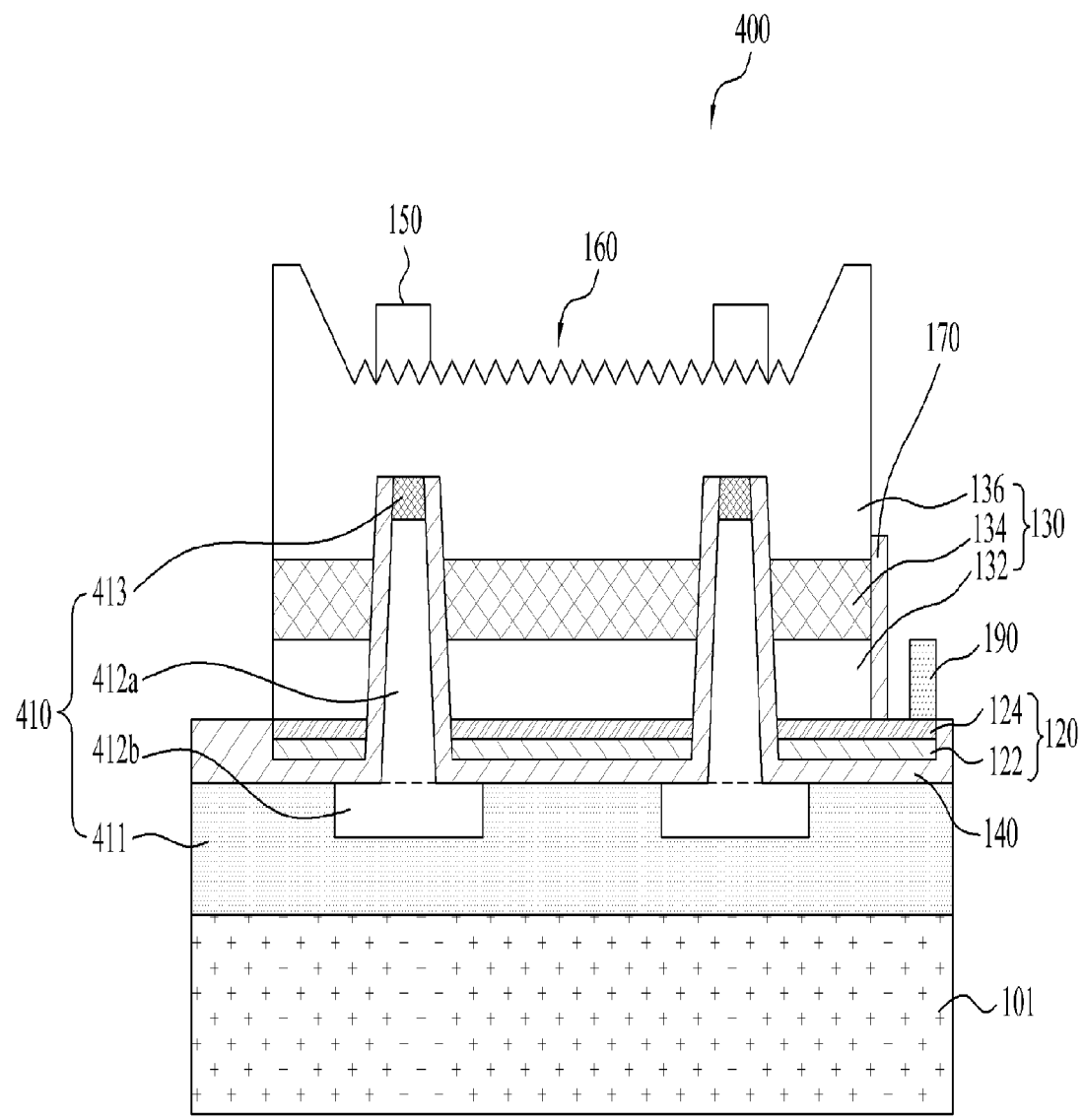
Figure 4D:
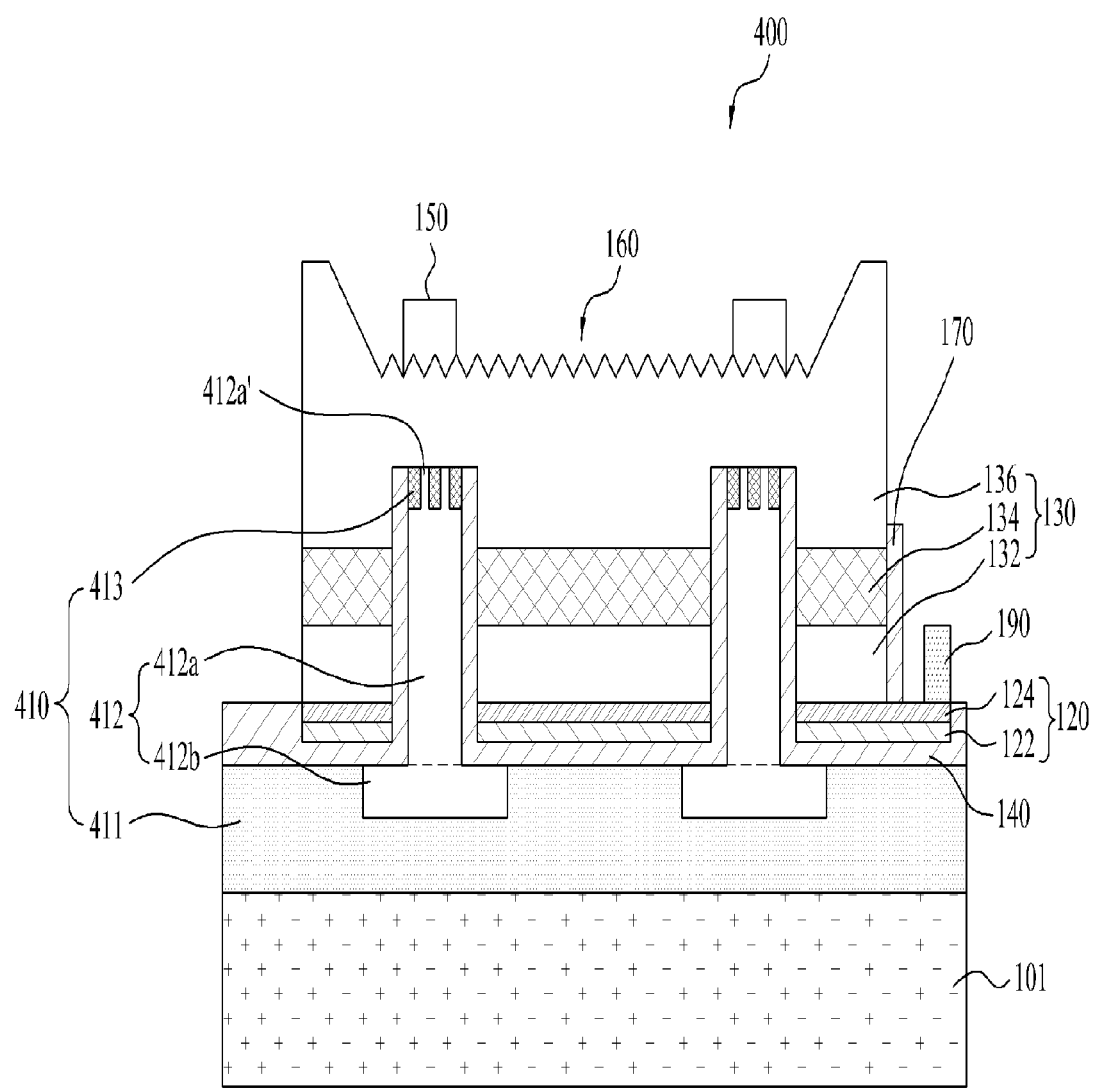

For an example, a reflective layer 412a' in contact with the ohmic layer 413 can be sloped as shown in FIG. 4B, or the ohmic layer 413 and the reflective layer 412a can be sloped as shown in FIG. 4C, or the reflective layer 412 can have a plurality of portions that passes through the reflective layer as shown in FIG. 4D.

FIGS. 5A~5H illustrate sections showing the steps of a method for fabricating a light emitting device in accordance with an embodiment.

Figure 5A:
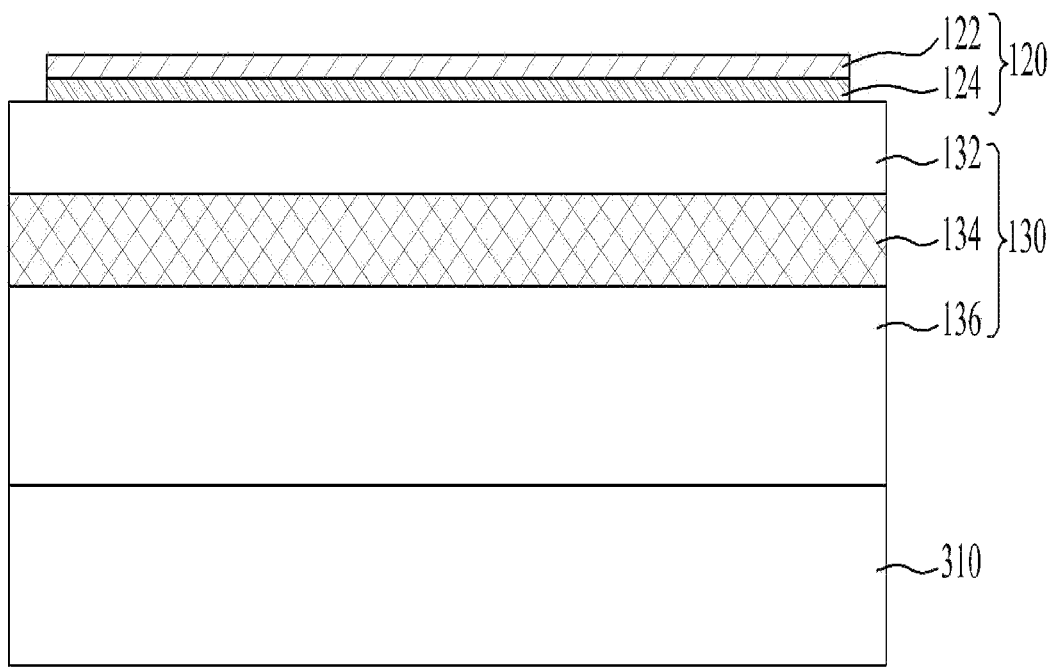
FIGS. 5A~5H illustrate sections showing the steps of a method for fabricating a light emitting device in accordance with a embodiment.

Referring to FIG. 5A, a light emitting structure 130 is grown on a growth substrate 310. The growth substrate 310 can be formed of at least one selected from, but not limited to, sapphire $Al_2O_3$, SiC, GaAs, GaN, ZnO, Si, GaP, InP, Ge.

A light emitting structure 130 can be formed by growing a first conductive type semiconductor layer 136, an active layer 134, and a second conductive type semiconductor layer 132 on the growth substrate 310 in succession.

The light emitting structure 130 can be formed by for an example, but not limited to, MOCVD; Metal Organic Chemical Vapor Deposition, CVD; Chemical Vapor Deposition, PECVD; Plasma-Enhanced Chemical Vapor Deposition, MBE; Molecular Beam Epitaxy, HVPE; Hydride Vapor Phase Epitaxy and the like.

A buffer layer (not shown) or/and an undoped nitride layer (not shown) can also be formed between the light emitting structure 130 and the growth substrate 310 for moderating a difference of lattice constants.

And, a second electrode layer 120 is formed on the second conductive type semiconductor layer 132. The second electrode layer 120 can have one of configurations of, but not limited to, ohmic layer/reflective layer/bonding layer, ohmic layer/reflective layer, or reflective layer/bonding layer. For an example, the ohmic layer 124 can be formed on the second conductive type semiconductor layer 132, and the reflective layer 122 can be formed on the ohmic layer 124.

The ohmic layer 124 and the reflective layer 122 can be formed by, for an example, one of E-beam deposition, Sputtering, and PECVD Plasma Enhanced Chemical Vapor Deposition. An area the ohmic layer 124 and the reflective layer 122 are formed therein can be selected, variously.

Figure 5B:
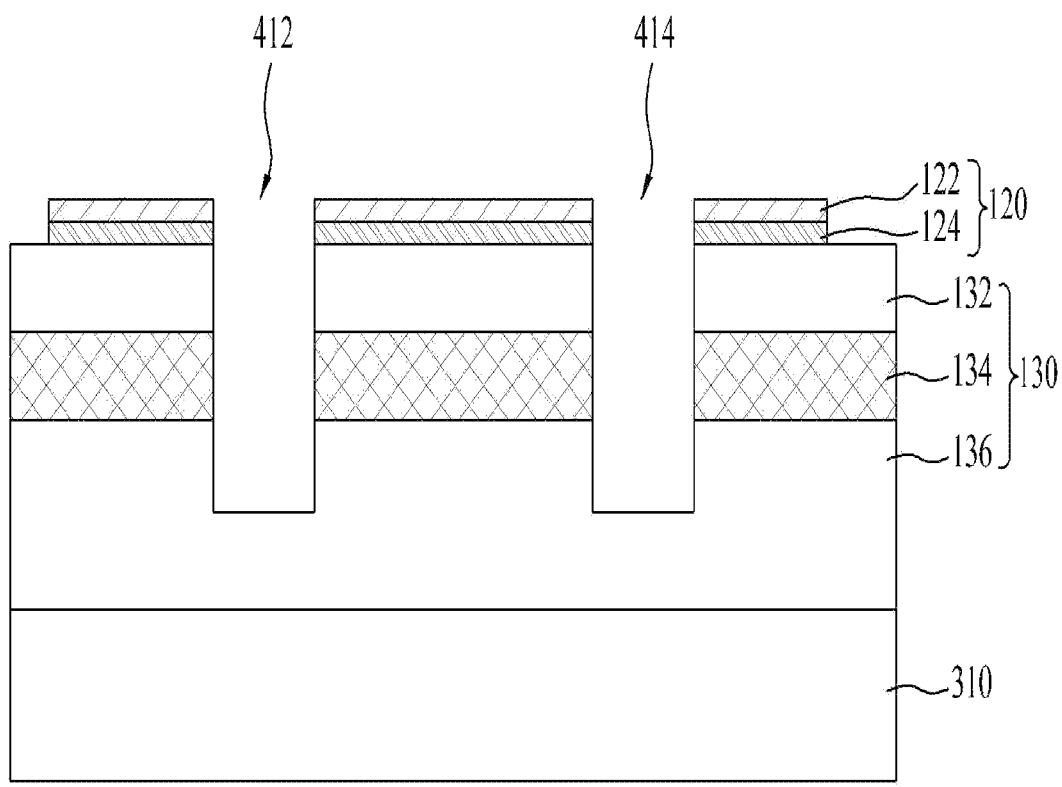

Next, referring to FIG. 5B, at least one hole 412 and 414 is formed to expose the first conductive type semiconductor layer 136 passed through the second electrode layer 120, the second conductive type semiconductor layer 132, and the active layer 134.

For an example, by using photolithography and etching, the second electrode layer 120, the second conductive type semiconductor layer 132, the active layer 134 and the first conductive type semiconductor layer 136 are etched selectively to form the at least one hole 412 and 414 which opens the first conductive type semiconductor layer 136.

Figure 5C:
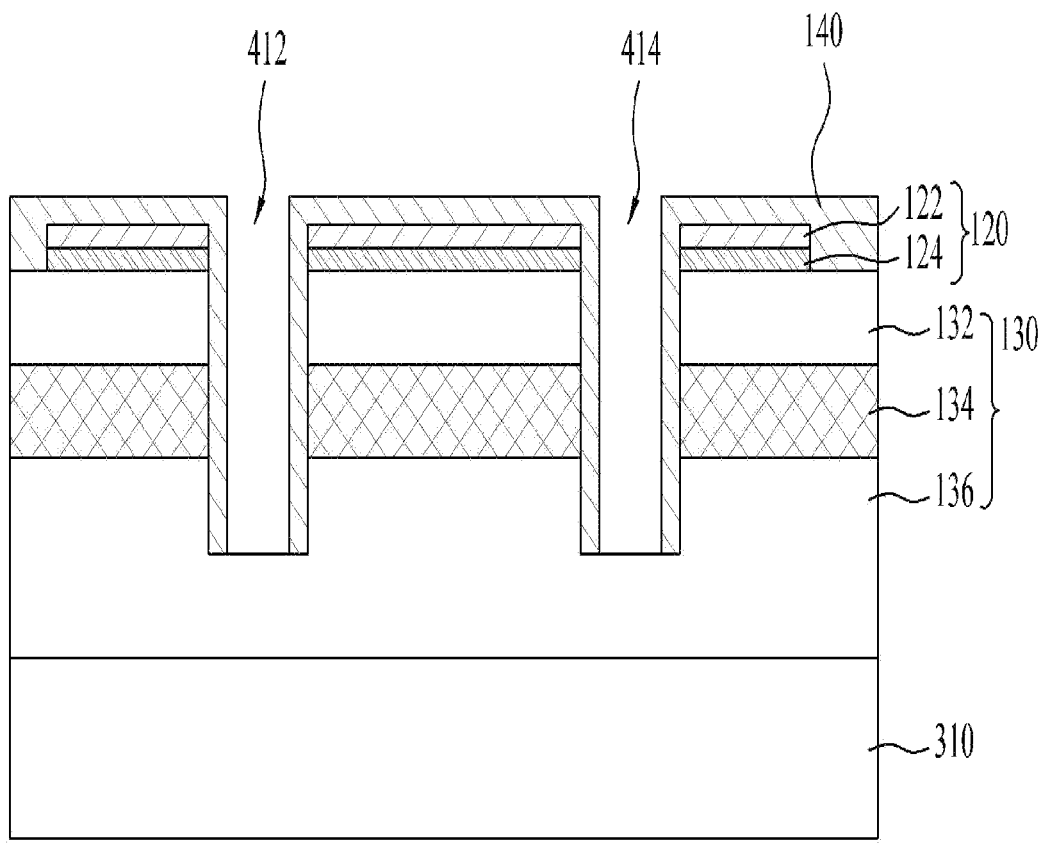

Next, referring to FIG. 5C, an insulating layer 140 is formed on the second electrode layer 120 and sides of the at least one hole 412 and 414. In this instance, the insulating layer 140 can be formed to surround the sides of the second electrode layer 120, but not at the bottom of the hole 412 and 414.

Figure 5D:
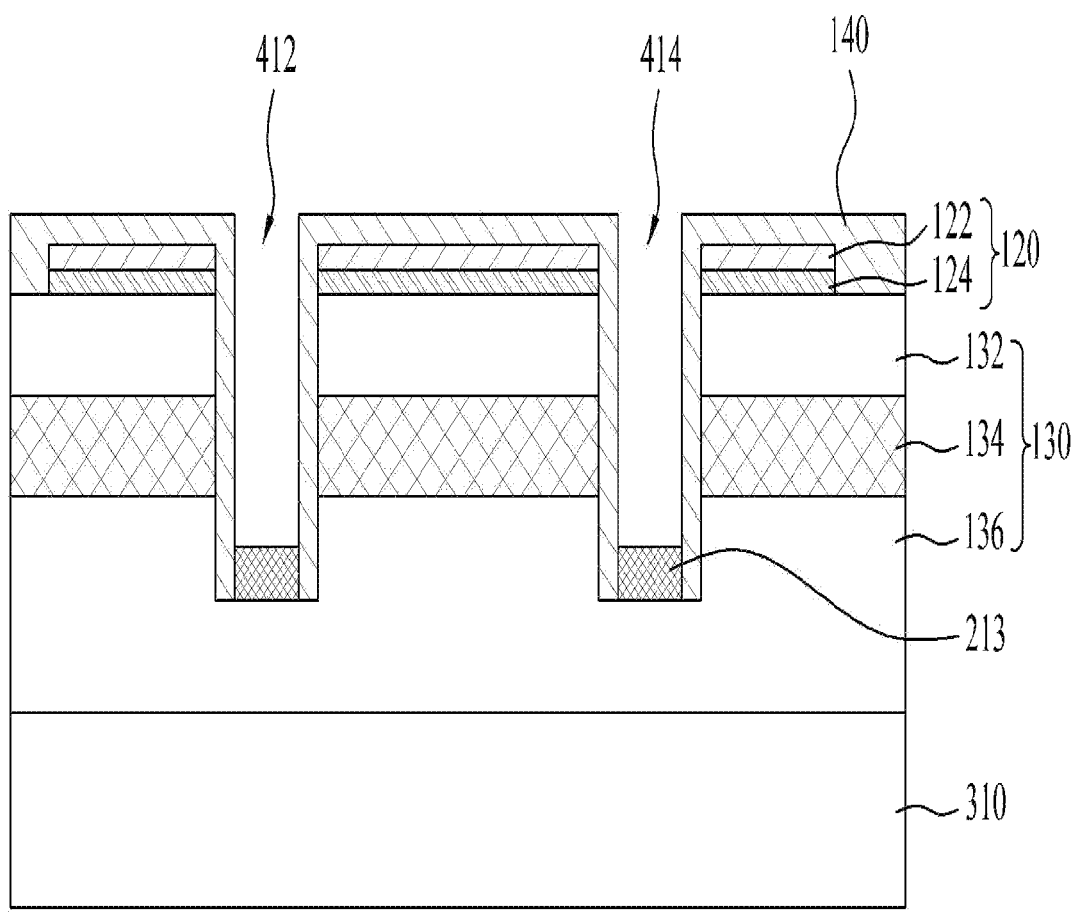

Next, referring to FIG. 5D, the hole 412 and 414 is filled with an ohmic layer 213 to form the ohmic layer 213 on the insulating layer 140 to be in contact with the first conductive type semiconductor layer 136. The ohmic layer 213 can be formed of a material identical to one described before.

Figure 5E:
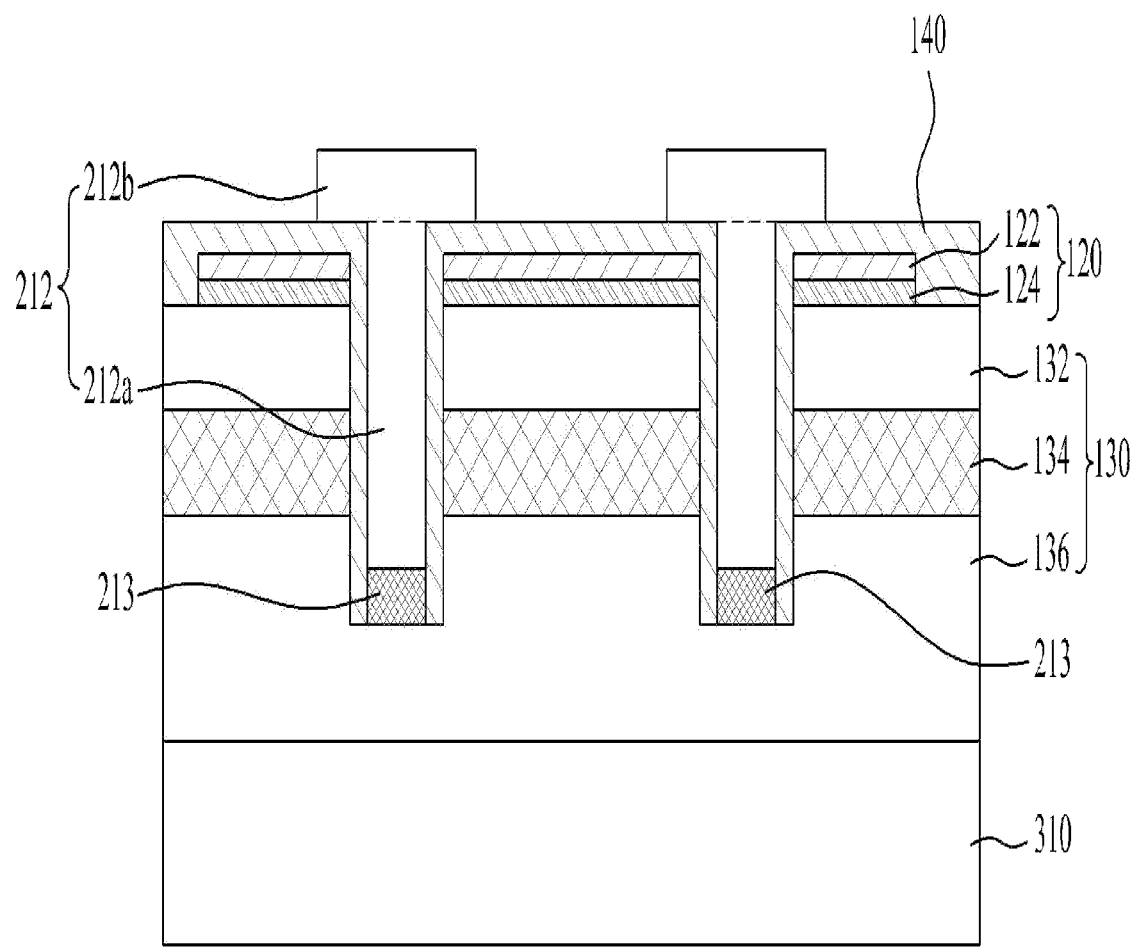

Next, referring to FIG. 5E, the hole 412 and 414 is filled with a reflective layer 212 to form the reflective layer 212 on the insulating layer 140 to be in contact with the ohmic layer 213. The insulating layer 212 can be formed of a material identical to one described before. Though it is described that the reflective layer 212 has the pass through portion 212a and the lower end portion 212b, this description is made only for conveniences' sake, the reflective layer 212 is filled in the hole 412 and 414 at a time to be in contact with the ohmic layer 213.

Figure 5F:
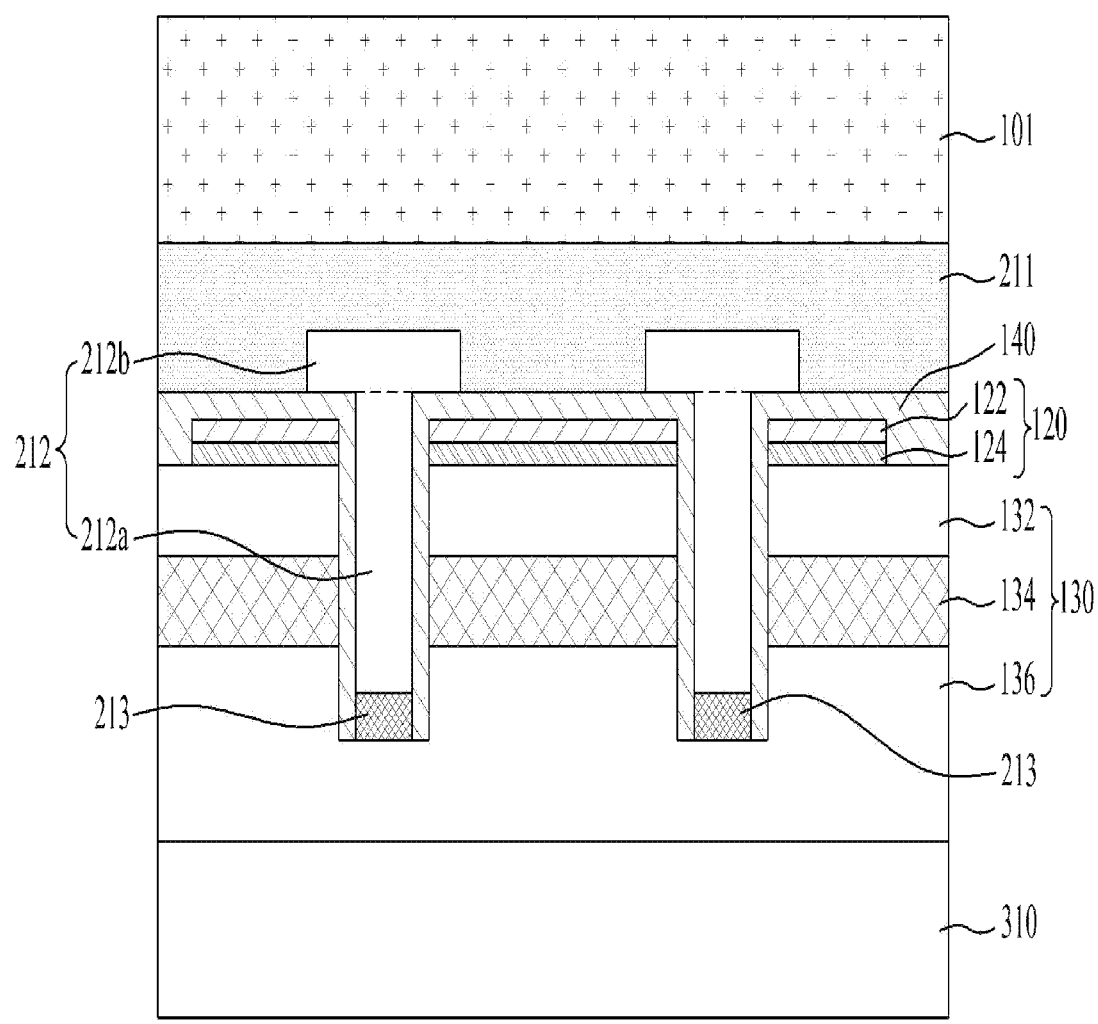

Next, referring to FIG. 5F, a bonding layer 211 is formed on the reflective layer 212 and the insulating layer 140. The bonding layer 211 is formed of a material the same as described before. And, a supporting substrate 101 is formed on the bonding layer 211. The supporting substrate 101 can be formed by bonding, plating, or deposition.

Figure 5G:
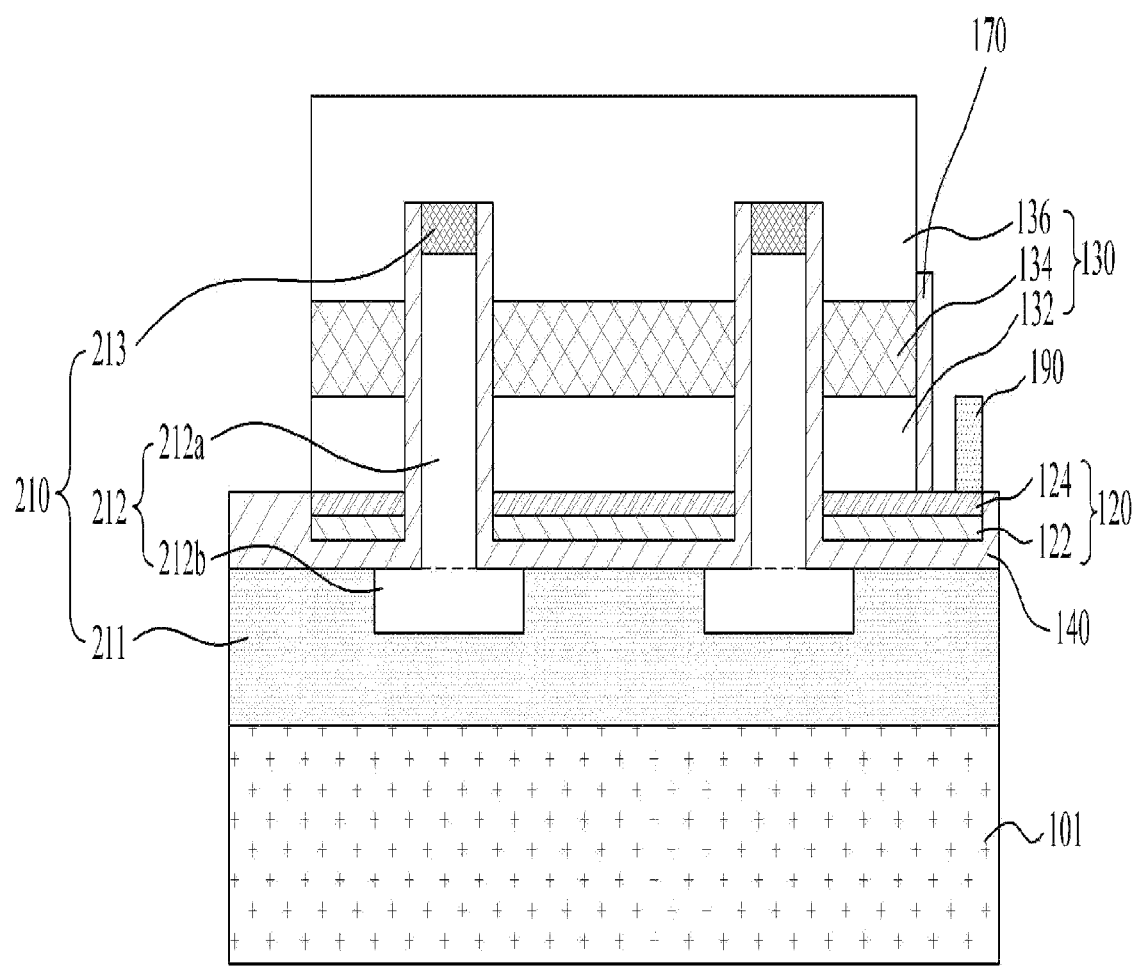

Next, referring to FIG. 5G, the growth substrate 310 is removed from the light emitting structure 130 by using Laser Lift Off or Chemical Lift Off. FIG. 5G illustrates the structure in FIG. 5F in an upside down position.

And, according to unit chip regions, the light emitting structure 130 is subjected to isolation etching to separate a plurality of light emitting structures. For an example, the isolation etching can be made by dry etching, like ICP (Inductively Coupled Plasma).

The isolation etching opens a portion of the second electrode layer 120 from the light emitting structure 130 by etching the light emitting structure 130.

Then, a passivation layer 170 is formed to cover sides of the light emitting structure 130. Though the passivation layer 170 can be formed at least to cover the sides of the second conductive type semiconductor layer 132 and the active layer 134 of the light emitting structure 130. And, a second electrode pad 190 is formed on the second electrode layer 120 opened thus.

Figure 5H:
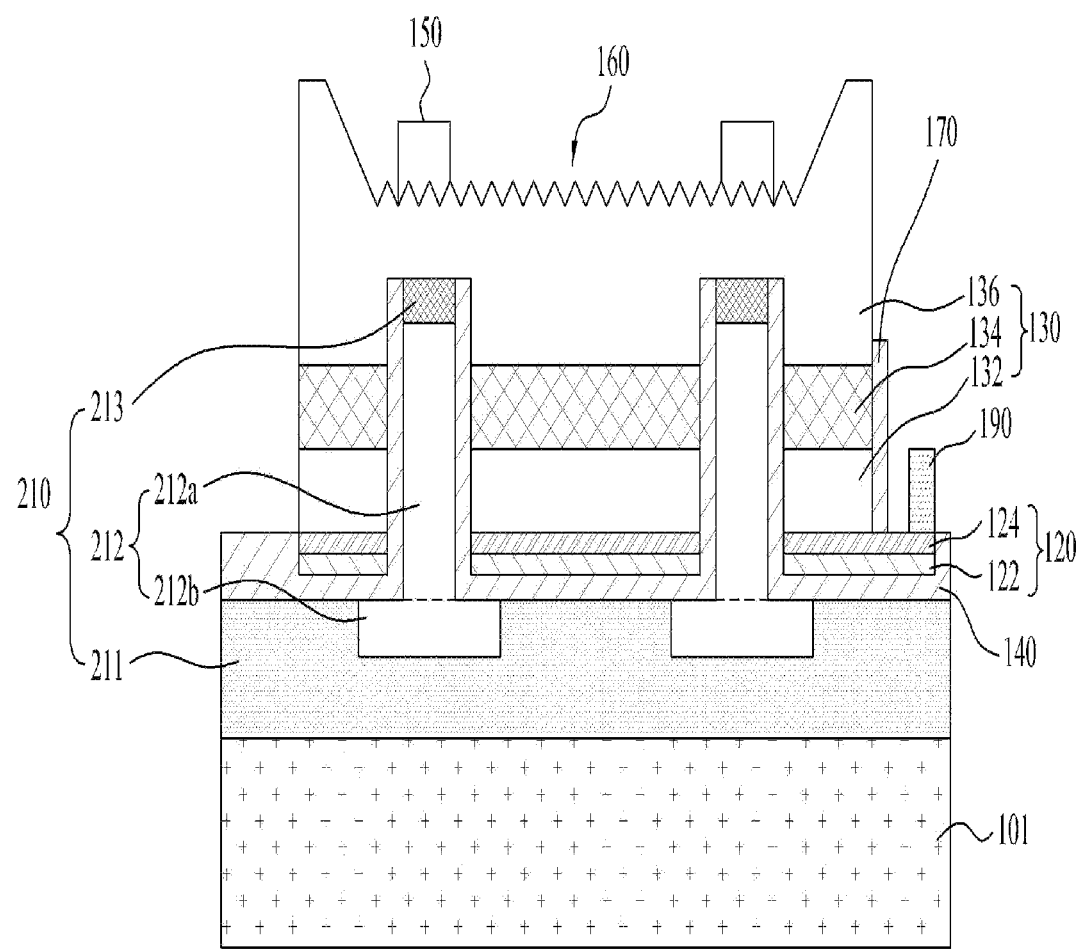

Next, referring to FIG. 5H, a roughness pattern 160 is formed on the first conductive type semiconductor layer 136. And, a re-absorption preventive layer 150 is formed on the first conductive type semiconductor layer 136. For an example, a re-absorption preventive material layer is formed on the first conductive type semiconductor layer 136, and subjected to patterning by photolithography and etching to form the re-absorption preventive layer 150. In this instance, the re-absorption preventive layer 150 can be patterned to overlap with the ohmic layer 213.

Figure 6:
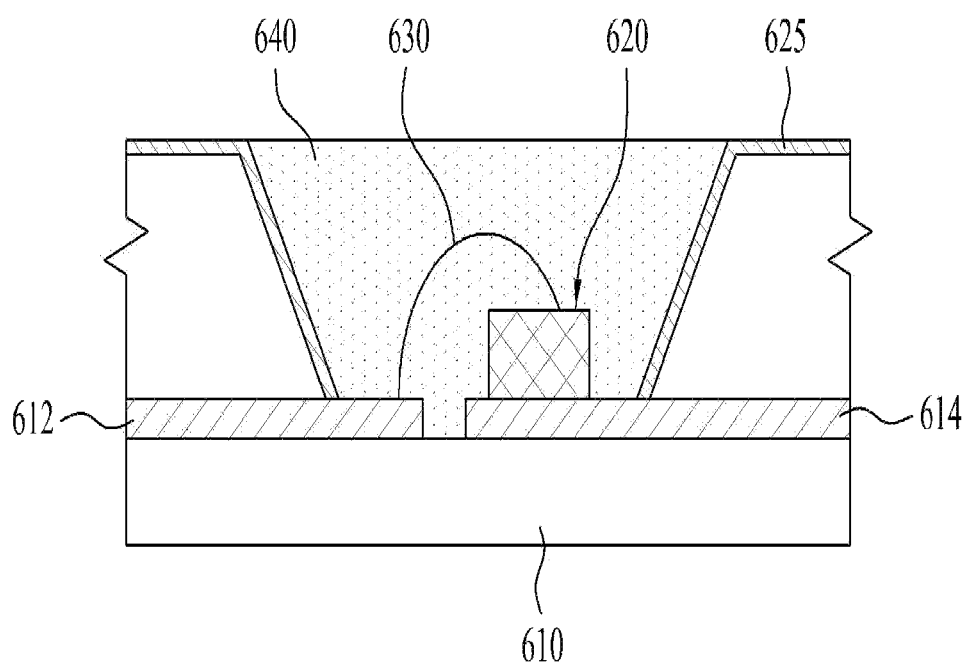
FIG. 6 illustrates a section showing a light emitting device package in accordance with an embodiment.

FIG. 6 illustrates a section of a light emitting device package in accordance with an embodiment.

Referring to FIG. 6, the light emitting device package includes a package body 610, lead frames 612 and 614, a light emitting device 620, a reflective plate 625, a wire 630, and a molded material 640.

The package body 610 can have a cavity formed on a top side thereof. In this instance, a side wall of the cavity can be sloped. The package body 610 can be constructed of a substrate having good insulating property or thermal conductivity, such as a silicon based wafer level package, a silicon substrate, silicon carbide SiC, aluminum nitride AlN, and Photo Solder Resist PSR and can have a structure in which a plurality of substrates are stacked. The embodiment does not limit a material, a structure and a shape of the body described above.

The lead frames 612 and 614 are mounted to the package body 610 so as to be separated electrically from the light emitting device taking heat dissipation and mounting of the light emitting device into account. The light emitting device 620 is connected to the lead frames 612 and 614, electrically. The light emitting device 620 can be any one of the light emitting devices in one of the embodiments described with reference to FIGS. 1~4.

The reflective plate 625 can be formed on the side wall of the cavity of the package body 610 such that a light from the light emitting device is directed toward a predetermined direction. The reflective plate 625 is formed of a light reflective material, for an example, can be a metal coating, or a metal foil.

The molded material 640 surrounds the light emitting device 620 positioned in the cavity of the package body 610 for protecting the light emitting device 620 from an external environment. The molded material 640 can be formed of a colorless transparent polymer resin material, such as epoxy or silicone. The molded material 640 can contain a fluorescent material for changing a wave length of the light from the light emitting device 620.

A plurality of the light emitting device packages in accordance with any one of the embodiments can be arranged on a substrate, and a light guide plate, a prism sheet, a diffusion sheet, and the like that are optical members can be arranged on a light path of the light emitting device package.

Figure 7:
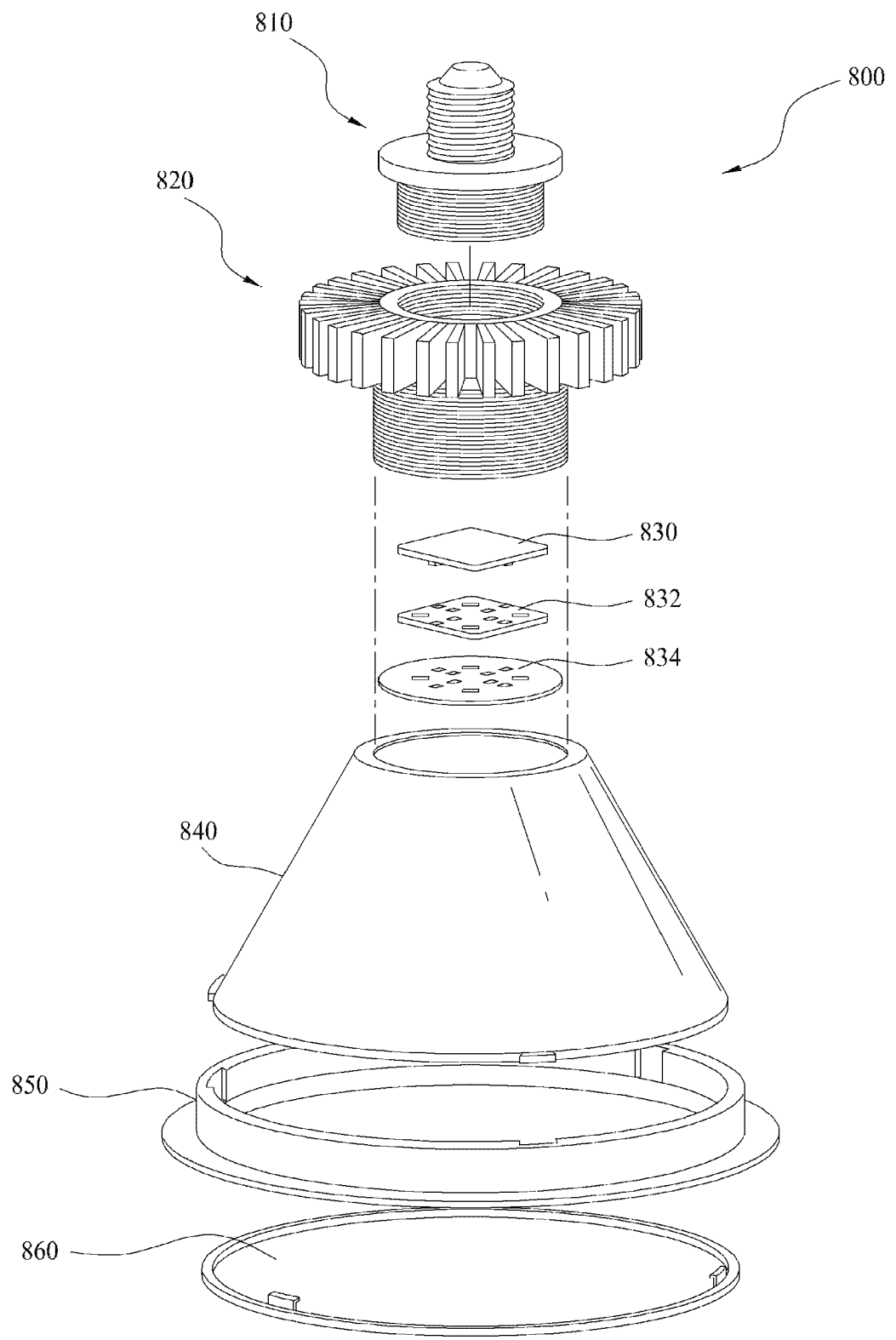
FIG. 7 illustrates an exploded perspective view of a lighting device having a light emitting device package in accordance with an embodiment.

FIG. 7 illustrates an exploded perspective view of a lighting device having a light emitting device in accordance with an embodiment. Referring to FIG. 7, the lighting device includes a power source coupler 810, a heat sink 820, a light emitting module 830, a reflector 840, a cover cap 850, and a lens unit 860.

The power source coupler 810 has a top side with a screw for placing in an external power source socket (not shown) to supply power to the light emitting module 830.

The heat sink 820 couples to the power source coupler 810, and a position of the heat sink 820 can be adjusted according to an extent of the coupling. For an example, the heat sink 820 has a top side screw coupled to a bottom side of the power source coupler 810. The heat sink 820 can dissipates heat from the light emitting module 830 through heat dissipating fins at a side thereof.

The heat sink 820 has a bottom side having the light emitting module 830 which includes the light emitting device packages mounted to a circuit board secured thereto. In this instance, the light emitting device packages can be the light emitting device package in accordance with the embodiment shown in FIG. 6.

The lighting device can include an insulating sheet 832 and a reflective sheet 834 under the light emitting module 830 for electric protection of the light emitting module, additionally. Moreover, optical members which can perform various optical functions can be arranged on a light travel path of the light from the light emitting module 830.

The reflector 840 of a circular truncated cone shape is coupled to an underside of the heat sink 820 for reflecting the light from the light emitting module 830. The cover cap 850 of a circular ring shape is coupled to an underside of the reflector 840. The lens unit 860 is placed in the cover cap 850. The lighting device in FIG. 6 can be used as a down light buried in a ceiling or wall of a building.

Figure 8:
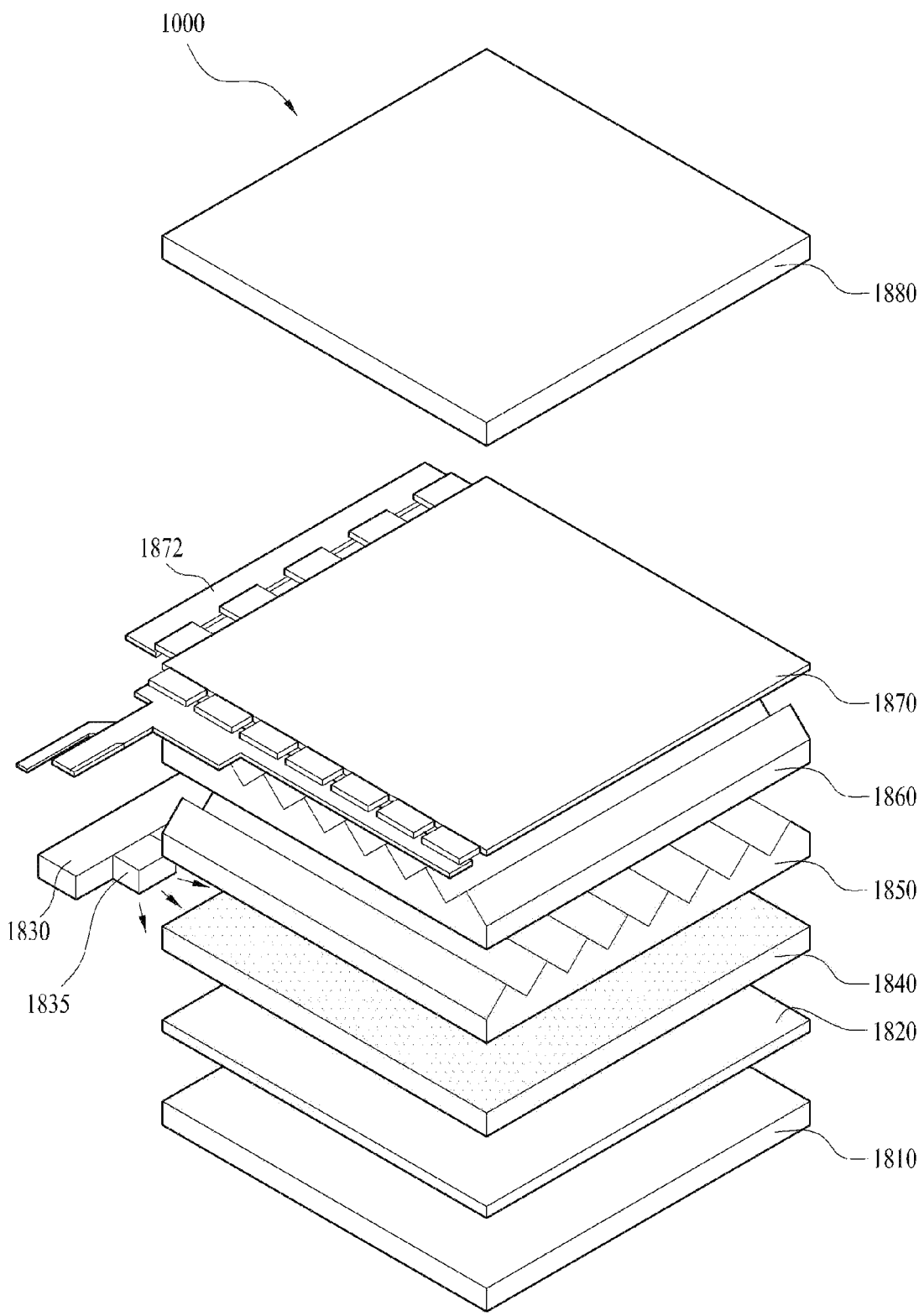
FIG. 8 illustrates a display device having the light emitting device in accordance with an embodiment.

FIG. 8 illustrates a display device having the light emitting device in accordance with an embodiment.

Referring to FIG. 8, the display device 1000 includes a bottom cover 1810, a reflective plate 1820 on the bottom cover 1810, a light source module 1830 and 1835 for emitting a light, a light guide plate 1840 arranged in front of the reflective plate 1820 for guiding the light from the light source module 1830 and 1835 to a front of the display device, optical sheets including prism sheets 1850 and 1860 arranged in front of the light guide plate 1840, a display panel 1870 arranged in front of the optical sheet, a picture signal forwarding circuit 1872 connected to the display panel 1870 for supplying a picture signal to the display panel 1870, and a color filter 1880 arranged in front of the display panel 1870. In this instance, the bottom cover 1810, the reflective plate 1820, the light source module 1830 and 1835, the light guide plate 1840, and the optical sheets can construe a backlight unit.

The light source module includes a light emitting device package 1835 on a substrate 1830. In this instance, the substrate 1830 can be a PCB or the like, and the light emitting device package 1835 can be one in FIG. 6.

The bottom cover 1810 can accommodate elements of the display device 1000. And, the reflective plate 1820 can be an individual element as shown in the drawing, or can be a coat of a material with a high reflectivity on a rear of the light guide plate 1840 or on a front of the bottom cover 1810.

In this instance, the reflective plate 1820 can be formed of a material which has high reflectivity and can form a micron-film, such as PET (PolyEthylene Terephtalate).

And, the light guide plate 1830 can be formed of PolyMethylMethAcrylate PMMA, PolyCarbonate PC, or PolyEthylene PE.

And, the first prism sheet 1850 can be formed of a polymer having light transmissivity and elasticity on one side of a supporting film. The polymer can have a prism layer with a plurality of three dimensional structures formed thereon, repeatedly. In this instance, as shown, the plurality of patterns can be a stripe type with repetitive ridges and grooves.

And, a direction of the ridges and the grooves in the second prism sheet 1860 can be perpendicular to a direction of the ridges and the grooves in the first prism sheet 1850, for uniform distribution of the light from the light source module and the reflective sheet to an entire surface of the display panel 1870.

And, though not shown, a diffusion sheet can be arranged between the light guide plate 1840 and the first prism sheet 1850. The diffusion sheet can be formed of a material selected from a polyester group and a polycarbonate group, for widening a light projection angle to the maximum by refraction and scattering of the light from the backlight unit. And, the diffusion sheet can include a supporting layer having light diffuser contained therein, and a first layer and a second layer both without the light diffuser contained therein formed on a light forwarding surface (a first prism sheet direction) and a light incident surface (a reflective sheet direction), respectively.

In the embodiment, though the diffusion sheet, the first prism sheet 1850 and the second prism sheet 1860 construe the optical sheet, the optical sheet can be constructed of other combination, for an example, a microlens array, a combination of the diffusion sheet and the microlens array, a combination of one prism sheet and the microlens array, or so on.

As the display panel 1870, a liquid crystal panel can be applied, and besides the liquid crystal panel 1860, other kind of display device which requires a light source can be applied.

As have been described, the light emitting device, the light emitting device package, and the lighting device with the same of the present invention have the following advantages.

A light emitting device which can improve light emitting efficiency, and widen a beam angle, and a light emitting device package, and a lighting device with the same can be provided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device, comprising:
   a light emitting structure including a first conductive type semiconductor layer, an active layer, and a second conductive type semiconductor layer;
   a second electrode layer formed on an underside of the light emitting structure and electrically connected to the second conductive type semiconductor layer;
   a first electrode layer that passes through the second conductive type semiconductor layer and the active layer to contact with the first conductive type semiconductor layer; and
   an insulating layer formed between the second electrode layer and the first electrode layer, between the second conductive type semiconductor layer and the first electrode layer, and between the active layer and the first electrode layer,
   wherein the first electrode layer includes a first ohmic layer in contact with the first conductive type semiconductor layer and a first reflective layer that passes through the second conductive type semiconductor layer and the active layer to have an extension to the first conductive type semiconductor layer, the first ohmic layer and the first reflective layer being formed of different materials, and
   wherein the first reflective layer is in direct contact with the first conductive type semiconductor layer.

2. The light emitting device as claimed in claim 1, wherein the first reflective layer is positioned on an underside of the first ohmic layer.

3. The light emitting device as claimed in claim 1, wherein the ohmic layer and the reflective layer are sloped.

4. The light emitting device as claimed in claim 1, wherein the first reflective layer has a portion in directly contact with the first conductive type semiconductor layer.

5. The light emitting device as claimed in claim 4, wherein an end portion of the first reflective layer surrounds the first ohmic layer.

6. The light emitting device as claimed in claim 4, wherein the first ohmic layer surrounds the end portion of the first reflective layer.

7. The light emitting device as claimed in claim 6, wherein the first reflective layer has at least one portion that passes through the first ohmic layer.

8. The light emitting device as claimed in claim 1, wherein the first reflective layer has a thickness thicker than the first ohmic layer.

9. The light emitting device as claimed in claim 8, wherein the first reflective layer is formed of one selected from the group consisting of Ag, Al and Rh, and a selective combination thereof.

10. The light emitting device as claimed in claim 1, wherein the first reflective layer has a reflectivity greater than 80%.

11. The light emitting device as claimed in claim 1, wherein the first electrode layer includes a bonding layer in contact with the insulating layer, and the first reflective layer is in contact with the insulating layer and the bonding layer.

12. The light emitting device as claimed in claim 11, wherein the bonding layer passes through the insulating layer and the second electrode layer to contact with an underside of the reflective layer.

13. The light emitting device as claimed in claim 1, wherein the first electrode layer further includes a bonding layer in contact with the insulating layer, and
the first reflective layer includes:
a first reflective portion that passes through the insulating layer, the second conductive type semiconductor layer, and the active layer, and
a second reflective portion positioned on an underside of the first reflective portion and having a width greater than a width of the first reflective portion.

14. The light emitting device as claimed in claim 13, wherein the width of the second reflective portion is less than 5 times of the width of the first reflective portion.

15. The light emitting device as claimed in claim 1, wherein the first conductive type semiconductor layer has an upper surface with a roughness formed thereon.

16. The light emitting device as claimed in claim 1, further comprising a re-absorption preventive layer formed on the first conductive type semiconductor layer.

17. The light emitting device as claimed in claim 1, wherein the second electrode layer comprises a second reflective layer and a second ohmic layer stacked between the light emitting structure and the insulating layer in succession; and
wherein the light emitting device further comprises an electrode pad formed on one side open region of the second ohmic layer and the second reflective layer.

18. The light emitting device as claimed in claim 17, further comprising a passivation layer formed at one side of the light emitting structure adjacent to the one side open region for preventing shorts circuits between the light emitting structure and the electrode pad.

19. A lighting device, comprising:
a power source coupler; and
a light emitting module fixed to a heat sink and including a light emitting device as claimed in claim 1, the light emitting module being mounted to a circuit board.

20. A display device, comprising:
a circuit board;
a light emitting device as claimed in claim 1, the light emitting device being mounted to the circuit board; and
a light guide plate for guiding light from the light emitting device.

* * * * *